United States Patent
Kim et al.

(10) Patent No.: US 6,516,441 B1
(45) Date of Patent: Feb. 4, 2003

(54) DEVICE AND METHOD FOR TRANSMITTING SUBFRAME IN MOBILE COMMUNICATION SYSTEM

(75) Inventors: Jae-Yoel Kim, Kyonggi-do (KR); Chang-Soo Park, Seoul (KR)

(73) Assignee: Samsung Electronics, Co., Ltd. (KR)

( * ) Notice: Subject to any disclaimer, the term of this patent is extended or adjusted under 35 U.S.C. 154(b) by 0 days.

(21) Appl. No.: 09/388,240

(22) Filed: Sep. 1, 1999

(30) Foreign Application Priority Data

Sep. 1, 1998 (KR) .............................................. 98-36383

(51) Int. Cl.[7] ........................ H03M 13/00; H03M 13/03
(52) U.S. Cl. ........................ 714/774; 714/755; 714/786
(58) Field of Search ................................. 714/774, 755, 714/786

(56) References Cited

U.S. PATENT DOCUMENTS

| | | | | |
|---|---|---|---|---|
| 4,047,151 A | * | 9/1977 | Rydbeck et al. | 714/774 |
| 5,442,646 A | * | 8/1995 | Chadwick et al. | 714/795 |
| 5,563,895 A | * | 10/1996 | Malkamaki et al. | 714/748 |
| 5,721,745 A | * | 2/1998 | Hladik et al. | 714/755 |
| 5,734,962 A | * | 3/1998 | Hladik et al. | 455/12.1 |
| 5,838,728 A | * | 11/1998 | Alamouti et al. | 375/265 |
| 5,850,403 A | * | 12/1998 | Lasne | 714/755 |
| 5,901,160 A | * | 5/1999 | Abe et al. | 714/774 |
| 5,912,706 A | * | 6/1999 | Kikuchi et al. | 375/240.13 |
| 5,949,822 A | * | 9/1999 | Hancharik | 375/242 |
| 5,974,584 A | * | 10/1999 | Hendrickson et al. | 714/800 |
| 6,023,783 A | * | 2/2000 | Divsalar et al. | 714/792 |
| 6,029,264 A | * | 2/2000 | Kobayashi et al. | 714/755 |
| 6,088,387 A | * | 7/2000 | Gelblum et al. | 375/222 |
| 6,157,642 A | * | 12/2000 | Sturza et al. | 370/389 |
| 6,285,681 B1 | * | 9/2001 | Kolze et al. | 370/442 |
| 6,298,463 B1 | * | 10/2001 | Bingeman et al. | 714/786 |
| 6,374,386 B1 | * | 4/2002 | Kim et al. | 714/86 |

OTHER PUBLICATIONS

Mark C. Reed and Steven S. Petrobon, "Turbo–code Termination Schemes and Novel Alternative for Short Frames", PIMRC '96, Oct. 15–18, 1996.

* cited by examiner

Primary Examiner—Albert Decady
Assistant Examiner—Joseph D. Torres
(74) Attorney, Agent, or Firm—Dilworth & Barrese, LLP

(57) ABSTRACT

A subframe data transmission device for a mobile communication system. A bit generator generates specific bits having a predetermined value. A bit inserter segments a received data bit stream into at least two subframes, and inserts the generated specific bits at locations where an error probability is higher in the respective subframes. A turbo coder codes the subframe data comprised of the data bit stream and the specific bits. The subframe is equal in size to an ARQ (Automatic Repeat Request) block, and the specific bits are inserted at a rear portion of the subframe. The bit inserter includes a delay for delaying the received data bit stream by the number of the specific bits to be inserted; and a selector for connecting, upon completion of receiving data bits for the subframe, the received data bits to the delay and applying an output of the bit generator to the turbo coder; and applying, when the specific bits are inserted, an output of the delay to the turbo coder.

7 Claims, 16 Drawing Sheets

DEVICE AND METHOD FOR TRANSMITTING SUBFRAME IN MOBILE COMMUNICATION SYSTEM

BACKGROUND OF THE INVENTION

1. Field of the Invention

The present invention relates generally to data communication device and method for a communication system, and in particular, to a frame constructing device and method for transmitting data on a subframe unit basis.

2. Description of the Related Art

As used herein, the term "data bit" refers to uncoded data, and the term "symbol" refers to data coded by a channel coder.

In communication systems for processing voice, character, image and video signals, data is generally transmitted on a frame unit basis. A frame is defined as a basic timing interval in the system. In a communication system employing packet switched transmission, throughput represents a ratio of the number of error-free frames to the number of the total received frames. When data is transmitted over a very long frame within a bad channel environment, error frames increase in number, thus reducing the throughput. In addition, the complexity of a receiver is proportional to the number of calculations performed, which is dependent on the length of the received frames. Therefore, in considering the reduced throughput experienced due to channel environment and receiver complexity, a method for dividing a frame into subframes and transmitting data using an ARQ (Automatic Repeat Request) technique is required.

However, a communication system which provides not only a voice service but also various data services, uses a channel coder having different features according to data rates and a service options. In particular, a convolutional coder is typically used for low rate transmission of voice and data, and a turbo coder is typically used for high rate data transmission. Further, in a system for communicating the frame data, a channel encoder for error correction should also encode data on the frame unit basis. In this case, the channel coder adds zero bits at the tail end of the sequence to indicate the termination of each frame so that a decoder can efficiently decode the frames using that information. An IS-95 system typically uses a non-recursive systemic convolutional coder, which adds a sequence of zero (0) bits to the end of each frame, equal to the number of delays, to implement frame termination.

Meanwhile, a typical turbo coder is comprised of two serial or parallel connected systemic convolutional coders and a turbo interleaver connected between the two systemic convolutional coders. Particularly, in a systemic convolutional coder used for a constituent coder of the turbo coder, termination is not implemented even though a sequence of zero bits are added to input data bits equal to the number of delays, in contrast to the non-recursive systemic convolutional coder. This is because the input data bits are fed back to the delays. The systemic convolutional coder employs a termination method using a feedback value and a method for performing decoding without termination. For more detailed information, see Mark C. Reed and Steven S. Pietrobon, "Turbo-Code Termination Schemes and a Novel Alternative for Short Frames", PIMRC '96, Oct. 15–18, 1996.

A relationship between a signal-to-noise ratio (SNR), and a bit error rate (BER) and a frame error rate (FER) depends on the type of the channel coder. For example, in a turbo coder, SNR required to maintain BER or FER is permitted to be lower, when the frame size (or length) becomes longer. However, in a convolutional coder, SNR required to maintain BER is relatively constant regardless of the frame size, whereas FER increases as the frame increases in size. Therefore, a subframe constructing method for minimizing performance of a communication system which uses two channel coders having different features is required.

It will be assumed herein that a convolutional coder has a constraint length K=9 and a coding rate R=1/3, and a turbo coder has a constraint length K=4 and a coding rate R=1/3.

FIG. 1 illustrates a conventional layered frame structure, in which subframes are taken into consideration. Here, a convolutional coder is used for a channel coder. The frame of FIG. 1 includes 4 layers of an interleaver block 101, a physical layer frame 102, a channel coding block 103 and an ARQ block 104. The interleaver block 101 may include several physical layer frames 102; contrariwise, the physical layer frame 102 may include several interleaver blocks 101. However, it will be assumed herein that one interleaver block 101 constitutes one physical layer frame 102. The physical layer frame 102 may include several channel coding blocks 103, and the channel coding block 103 may include several ARQ blocks 104. Each ARQ block 104 is comprised of data bits and zero (0) bits. For better understanding, a description will be made with reference to a case where a data rate of 38.4 Kbps is used. Hereinafter, it will be assumed that a CRC (Cyclic Redundancy Code) is comprised of 16 bits.

When the ARQ block 104 is a single ARQ block, the ARQ block 104 includes N (=744) data bits, 16 CRC bits and 8 tail bits, so that the frame is comprised of 768 bits in total. However, when the ARQ block 104 is comprised of two subblocks of first and second ARQ blocks 104-A and 104-B, the first ARQ block 104-A includes 360 first data bits 111, 16 first CRC bits 112 and 8 first additional bits 113, and the second ARQ block 104-B includes 360 second data bits 121, 16 second CRC bits 122 and 8 convolutional tail bits 123, so that the frame is comprised of 768 bits in total. However, in either case, the number of data bits input to the channel coding block 103 is fixed to 768, and the number of channel coded symbols for the 768 data bits becomes 768×3=2304. In the case where the ARQ block 104 is comprised of the first and second ARQ blocks 104-A and 104-B, the frame additionally includes the 16 first CRC bits 112 and the 8 first additional bits 113, undesirably causing an increase in overhead. However, it is advantageous in that retransmission can be performed using the ARQ. In addition, when the first additional bits 113 are comprised of 8 zero bits, these first additional bits 113 can be used as tail bits for termination of the first ARQ block 104-A.

Herein, the additional bits are comprised of 8 consecutive zero bits, and the number of the additional bits can be varied. As illustrated in FIG. 1, when a convolutional coder is used, the first additional bits 113 can be used for termination of the first ARQ block 104-A. Even in the case where the ARQ block 104 is comprised of several sub ARQ blocks 104-A and 104-B, the additional bits can be used for termination. Since the first and second ARQ blocks 104-A and 104-B are independently terminated, it is possible to simultaneously decode the two sub ARQ blocks in parallel at a receiver. That is, in the convolutional coder, even though the subframe structure is used, the channel coding block and the ARQ block can be equal in size to each other because of the additional bits.

FIG. 2 illustrates another conventional layered frame structure, in which subframes are taken into consideration.

Here, a turbo coder is used for a channel coder. In the frame of FIG. 2, turbo tail bits 223 are comprised of 8 bits, values of which are not consecutive zero bits but are varied according to feedback values from a recursive convolutional coder constituting the turbo coder. In FIG. 2, since a turbo interleaver existing in a channel coding block 103 performs turbo coding after scrambling the data of the whole ARQ block 104, it is not possible to independently decode the sub ARQ blocks as in FIG. 1. That is, in the turbo coder, even though the ARQ block 104 is comprised of several sub ARQ blocks, decoding should be performed at a time for the whole ARQ block to decode the data for each sub ARQ block. In this case, although the ARQ block 104 is segmented into sub ARQ blocks 104-A and 104-B, it is not possible to simultaneously decode the sub ARQ blocks in parallel as in the convolutional coder.

Therefore, in a mobile communication system using the turbo coder, it is preferable to maximize performance of the turbo coder by adding the benefits of the convolutional coder, in considering a subframe constructing method for ARQ transmission.

SUMMARY OF THE INVENTION

It is, therefore, an object of the present invention to provide a device and method for constructing transmission frames in a subframe unit suitable for transmitting data in a mobile communication system using a turbo coder.

It is another object of the present invention to provide a device and method for constructing a layered frame in which subframes are taken into consideration, wherein predetermined specific bits are inserted at locations where error probability is higher in the frame before coding, in a mobile communication system.

It is a further object of the present invention to provide a device and method for constructing transmission frames in a subframe unit suitable for transmitting data, inserting predetermined specific bits at locations where error probability is higher in the subframe before coding, and then transmitting the coded frame data, in a mobile communication system using a turbo coder.

To achieve the above objects, there is provided a subframe data transmission device for a mobile communication system. A bit generator generates specific bits having a predetermined value. A bit inserter segments a received data bit stream into at least two subframes, and inserts the generated specific bits at locations where an error probability is higher in the respective subframes. A turbo coder codes the subframe data comprised of the data bit stream and the specific bits. The subframe is equal in size to an ARQ (Automatic Repeat Request) block, and the specific bits are inserted at a rear portion of the subframe.

The bit inserter comprises a delay for delaying the received data bit stream by the number of the specific bits to be inserted; and a selector for connecting, upon completion of receiving data bits for the subframe, the received data bits to the delay and applying an output of the bit generator to the turbo coder; and applying, when the specific bits are inserted, an output of the delay to the turbo coder.

BRIEF DESCRIPTION OF THE DRAWINGS

The above and other objects, features and advantages of the present invention will become more apparent from the following detailed description when taken in conjunction with the accompanying drawings in which.

DETAILED DESCRIPTION OF THE PREFERRED EMBODIMENTS

Preferred embodiments of the present invention will be described herein below with reference to the accompanying drawings. In the following description, well-known functions or constructions are not described in detail since they would obscure the invention in unnecessary detail.

Figure 3:
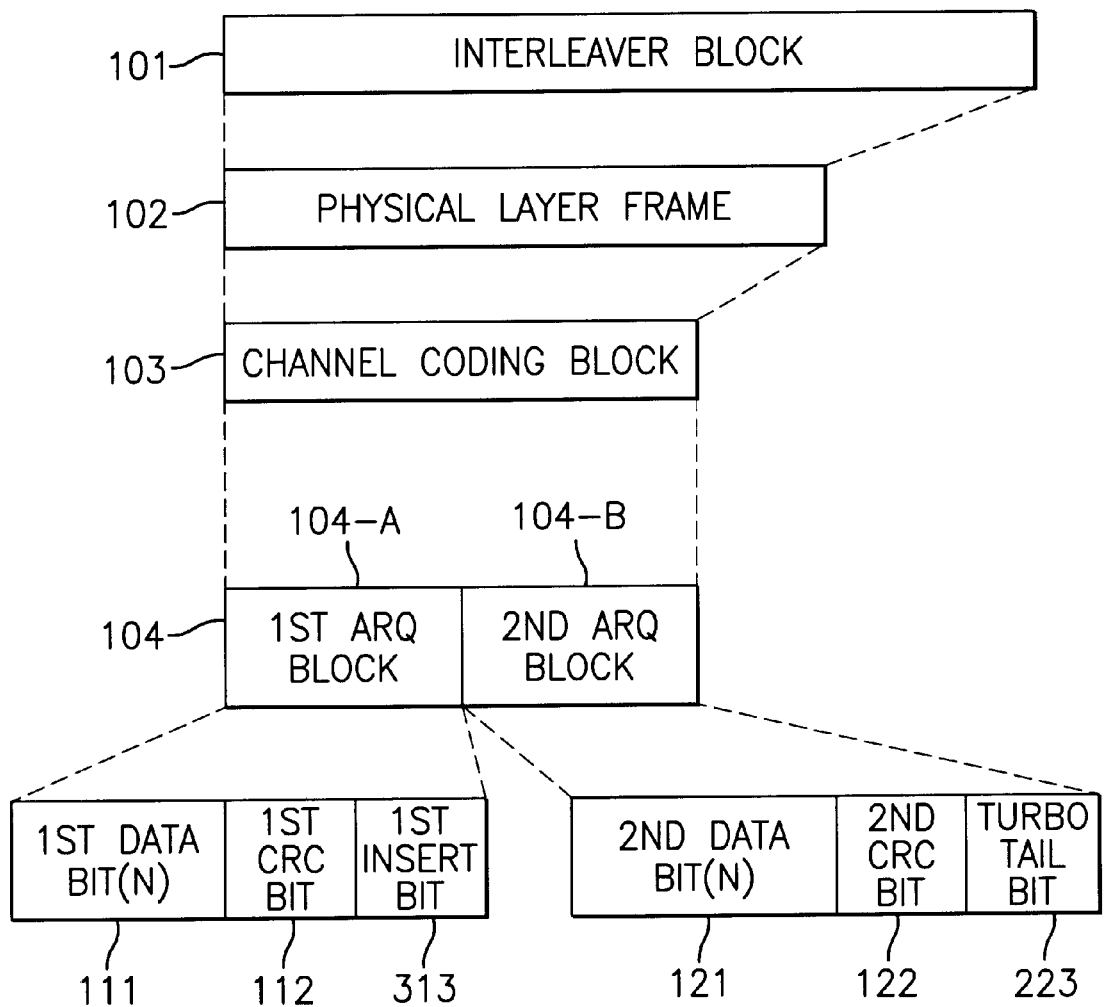
FIG. 3 is a diagram illustrating a layered frame structure, in which subframes are taken into consideration, for a mobile communication system using a turbo coder according to an embodiment of the present invention.

FIG. 3 illustrates a layered frame structure, in which subframes are taken into consideration, according to a first embodiment of the present invention. Here, a turbo coder is used for a channel coder.

In a first embodiment of FIG. 3, predetermined specific bits are inserted at the locations where error probability is relatively higher in a frame of an ARQ block 104. The error probability is determined by way of experiment, and the insert locations should be known to both the channel coder and a channel decoder. If the locations and values of the bits inserted are known to both the receiving party and transmitting party, the specific bits are insignificant, regardless of whether they are transmitted or not. In addition, in a case where the transmitting party and the receiving party predetermine with each other to utilize a control information bit as the inserting bit, the inserting bit can be used for the specific bits. In this case, the specific bits should be transmitted.

It will be assumed herein that the specific bits to be inserted have a value "0" and the specific bits inserted after coding in a turbo coder are not transmitted. In addition, the inserted specific bits will be referred to as "insert bits".

The turbo coder is comprised of a part for outputting input data bits, as they are, and a part for outputting parities. Since the data bit outputting part punctures specific bits positioned at predetermined insert locations, it is allowable not to transmit the insert bits. However, on the contrary, the insert bits may have a value "1" and it is also allowable to transmit the insert bits after turbo coding. In addition, FER performance may depend on the number of the insert bits. That is, it is apparent that FER performance is improved (i.e., FER is decreased), when the insert bits increase in number.

Figure 1:
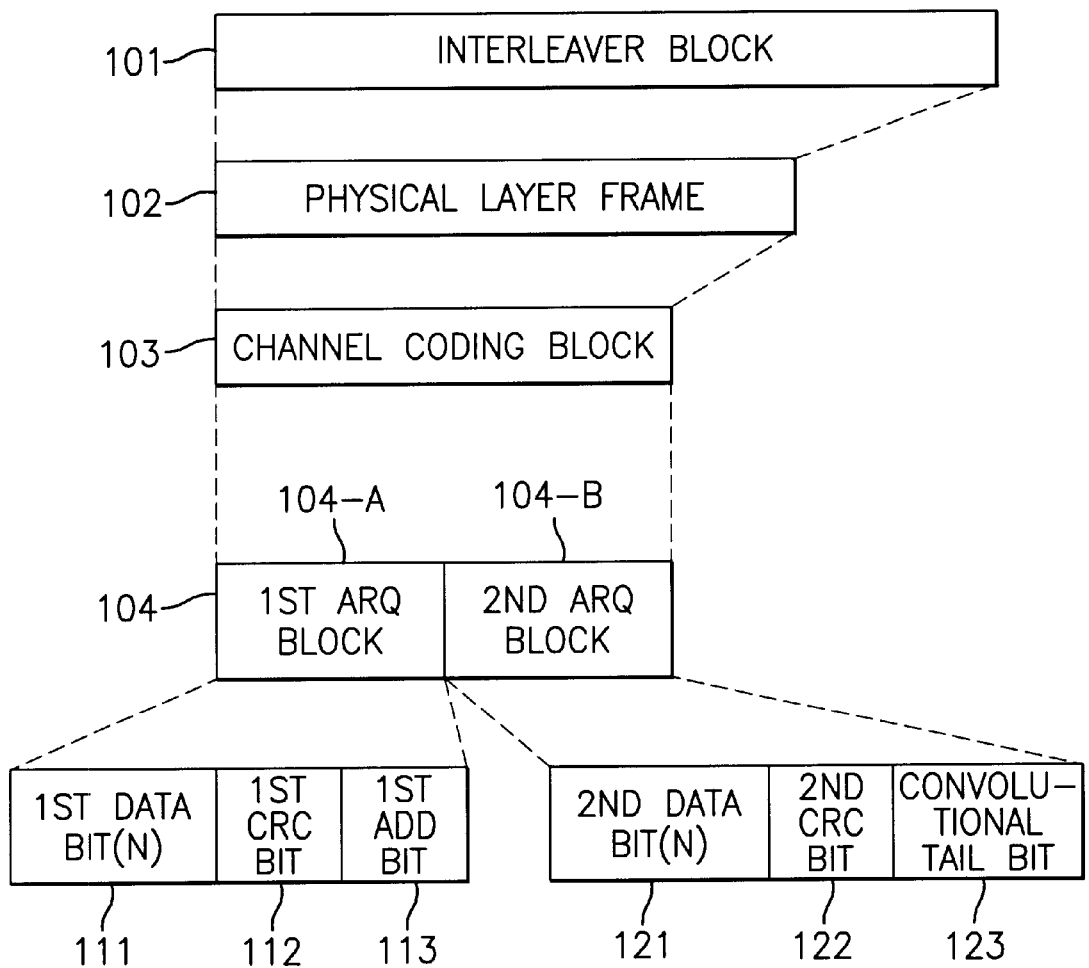
FIG. 1 is a diagram illustrating a layered frame structure, in which subframes are taken into consideration, for a conventional mobile communication system using a convolutional coder.
Figure 2:
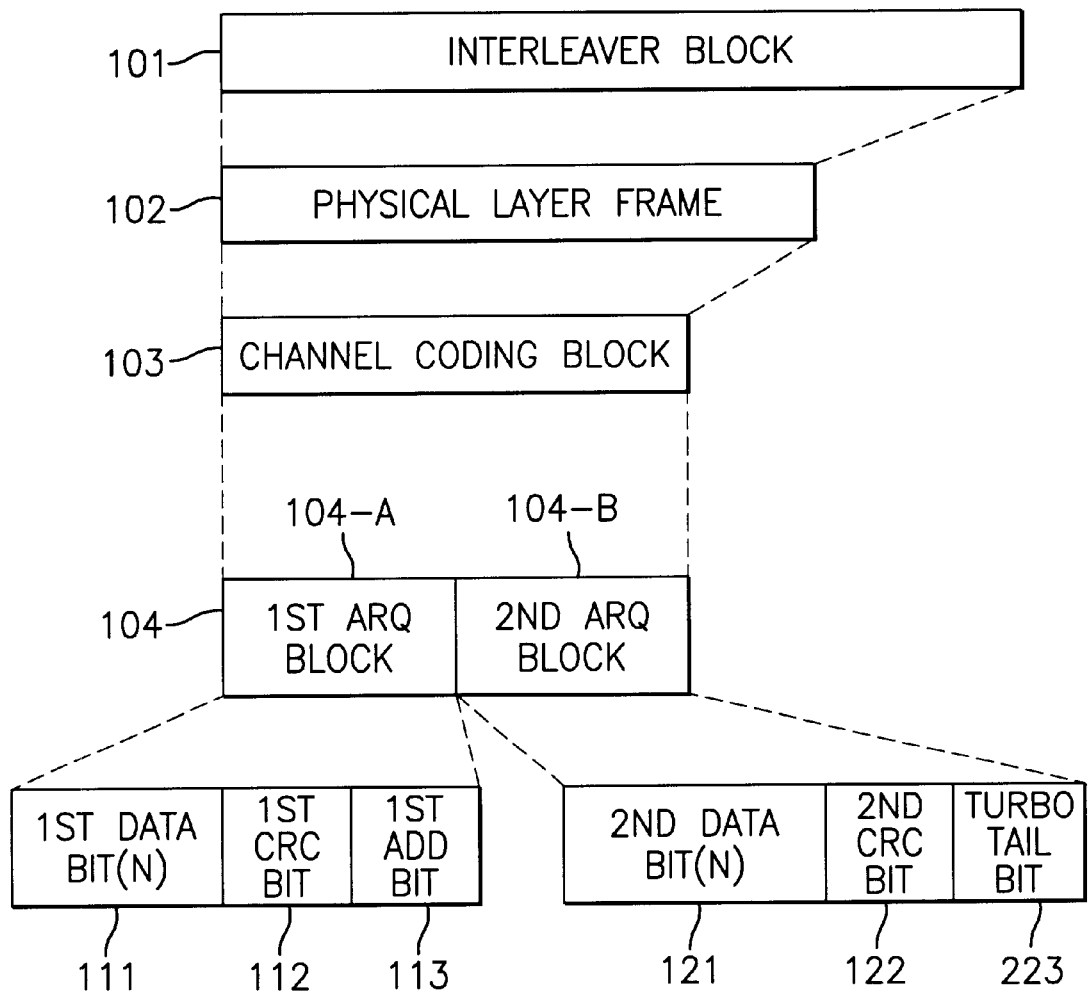
FIG. 2 is a diagram illustrating a layered frame structure, in which subframes are taken into consideration, for a conventional mobile communication system using a turbo coder.

In the meantime, the additional bits of FIGS. 1 and 2 are consecutively added bits, whereas the insert bits can be either the consecutively added bits or the bits dispersedly distributed in the whole ARQ frame. This is because there is no necessity for consecutively transmitting the insert bits, since the turbo coder codes the whole ARQ frame at a time, although in the convolutional coder, the additional bits should be consecutively transmitted in a quantity equal to the number of delays so that the additional bits can be used for termination of the subframe.

In the first embodiment, it is assumed that the frame has a data rate of 38.4 Kbps as in FIG. 1. In FIG. 3, first and second data bits 111 and 121 are comprised of 360 bits; first and second CRC bits 112 and 122 are comprised of 16 bits; first insert bits 313 total 12 bits; and turbo tail bits 223 total 8 bits. Thus, the frame is comprised of 772 bits in total and the number of channel coded symbols becomes 772×3= 2316. That is, the number of the first insert bits is greater than the number of the additional bits shown in FIG. 1 by 4. However, when the channel coded symbols are punctured in a quantity equal to the number of insert bits, the quantity of final symbols output from the turbo coder becomes 2316− 12=2304. In addition, as described above, since the insert bits are inserted at locations previously scheduled with the receiving party with predetermined values, it is allowable not to transmit the insert bits after channel coding by the transmitting party. In this case, it is possible to obtain a rate matching effect by puncturing the insert bits. Therefore, the number of the final symbols output from the channel coder can be identical to or smaller than the number of the symbols shown in FIG. 1.

Figure 4:
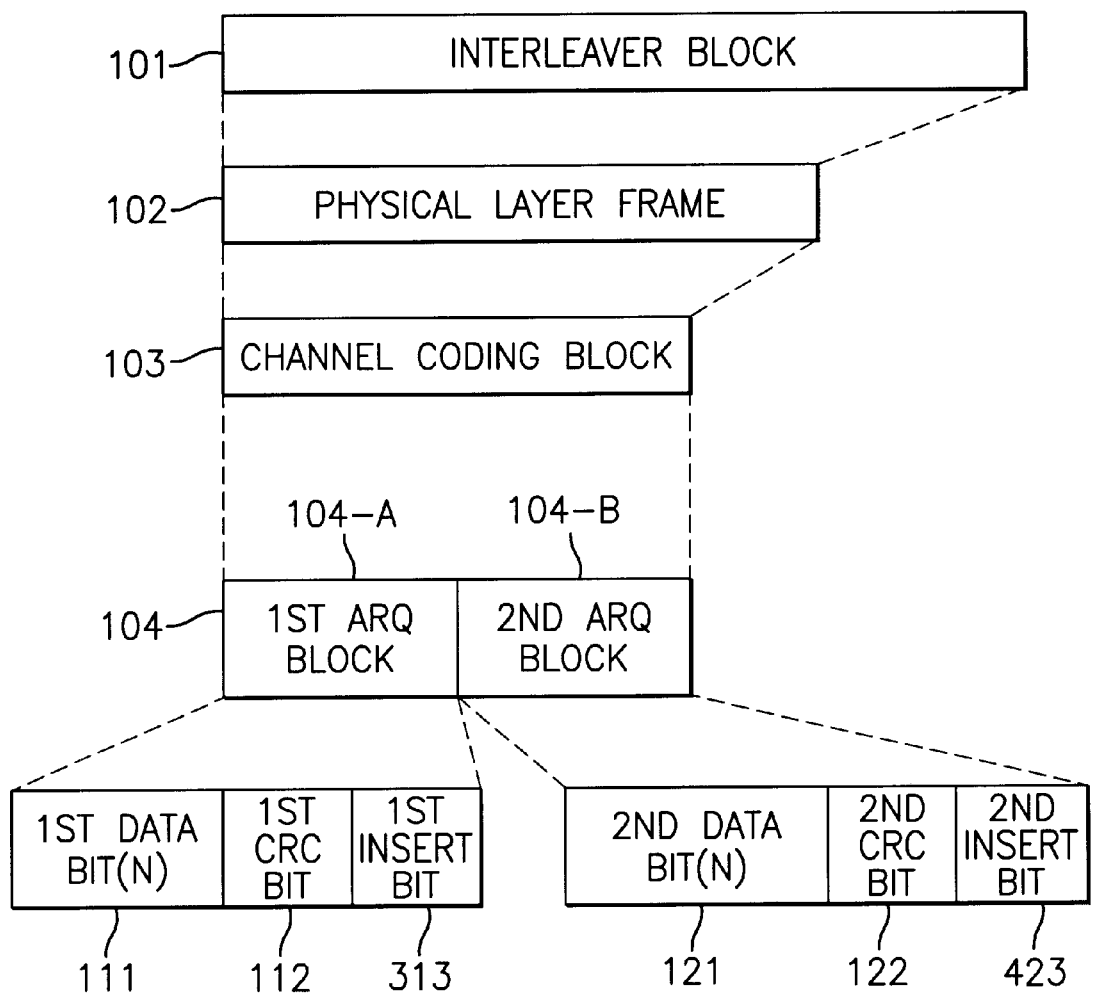
FIG. 4 is a diagram illustrating a layered frame structure, in which subframes are taken into consideration, for a mobile communication system using a turbo coder according to an embodiment of the present invention, wherein the turbo coder does not perform termination using turbo tail bits.

FIG. 4 illustrates a layered frame structure, in which subframes are taken into consideration, according to a second embodiment of the present invention. In this embodiment, a turbo coder, which is used as a channel coder, does not perform termination using the turbo tail bits. This is because the turbo decoder can perform decoding even without termination. For more information, please see Mark C. Reed and Steven S. Pietrobon, "Turbo-Code Termination Schemes and a Novel Alternative for Short Frames", PIMRC '96, Oct. 15–18, 1996.

Referring to FIG. 4, second insert bits 423 are inserted to compensate for performance degradation caused by non-termination of the ARQ frame. Like the first insert bits 313, the second insert bits 423 are predetermined specific bits inserted at the locations where error probability is relatively higher in the whole ARQ block 104. The error probability for inserting the second insert bits is determined by way of experiment, and the insert locations should be known to both the channel coder and a channel decoder. If the locations and values of the insert bits are known to both a receiving party and a transmission party, the specific bits are insignificant no matter whether they are transmitted or not. In addition, separate data bits other than the coded bits, previously scheduled with the receiving party, can be used for the specific bits. In this case, the specific bits are transmitted, as they are. It will be assumed herein that specific values of the second insert bits are "0"s and the specific bits of the turbo coder after turbo coding are not transmitted.

Figure 5:
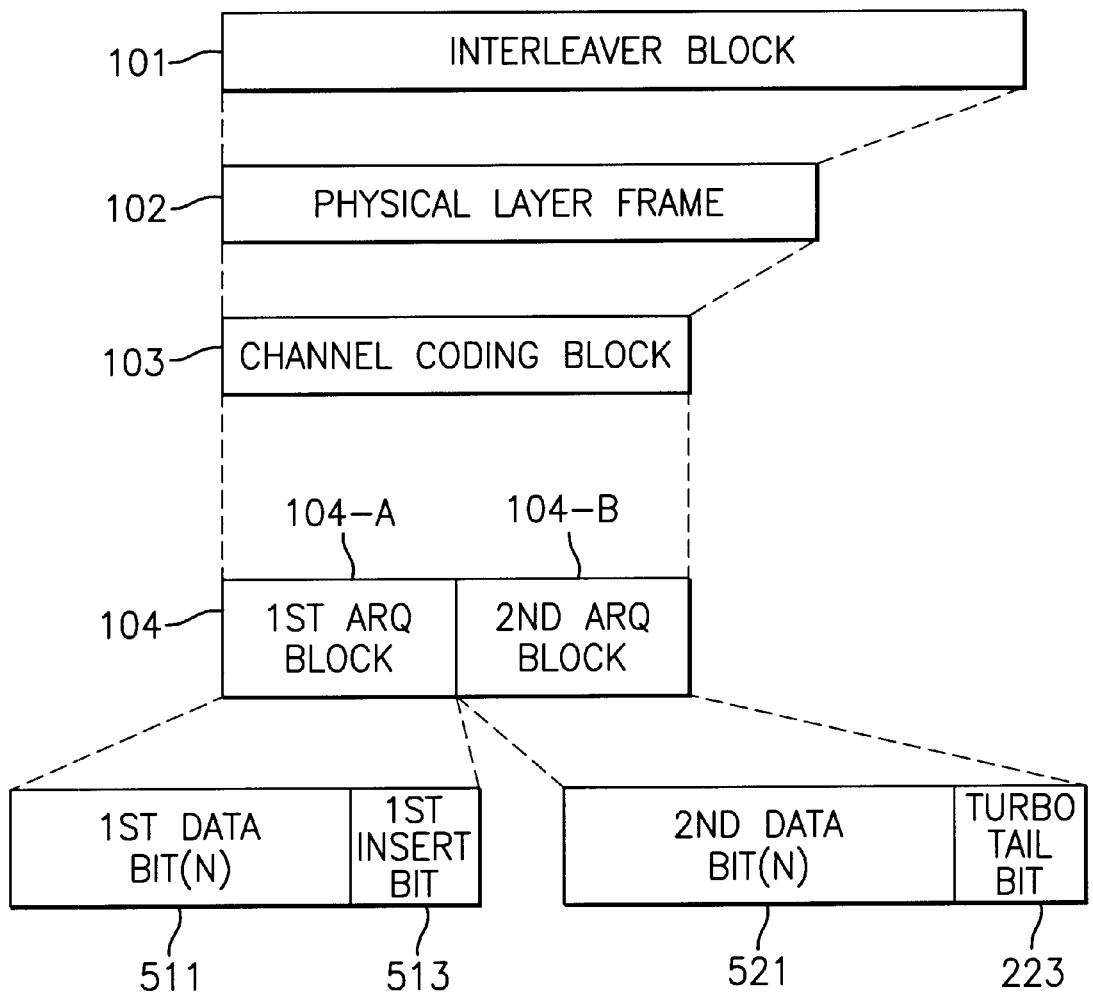
FIG. 5 is a diagram illustrating a layered frame structure, in which subframes are taken into consideration, for a mobile communication system using a turbo coder according to an embodiment of the present invention, wherein CRC bits are not used.

FIG. 5 illustrates a layered frame structure, in which subframes are taken into consideration, according to a third embodiment of the present invention. In this embodiment, a turbo coder, which is used for a channel coder, does not use CRC bits.

Referring to FIG. 5, the turbo coder performs termination using turbo tail bits. In the turbo coder, since channel coding is performed not in a unit of the whole ARQ frame 104 but in a unit of subframe, it is possible to remove the CRC bits to increase throughput and performance of the channel coder. That is, in the convolutional coder, when an ARQ frame is divided into sub ARQ frames before transmission using additional bits comprised of 8 zero bits, a receiving party can perform decoding in a unit of sub ARQ frame. However, since the turbo coder can perform decoding in a unit of the whole ARQ frame, it is possible to increase throughput or improve performance of the turbo coder by removing the CRC bits from the subframes for the convolutional coder and then either transmitting more data bits or increasing the quantity of insert bits to equal the quantity of the CRC bits. In FIG. 5, first data bits 511 and second data bits 521 can increase in quantity to equal the quantity of the CRC bits shown in FIGS. 3 and 4. Alternatively, it is also possible to improve performance of the turbo coder by increasing the quantity of first insert bits 513 to twice that of the CRC bits.

Figure 6:
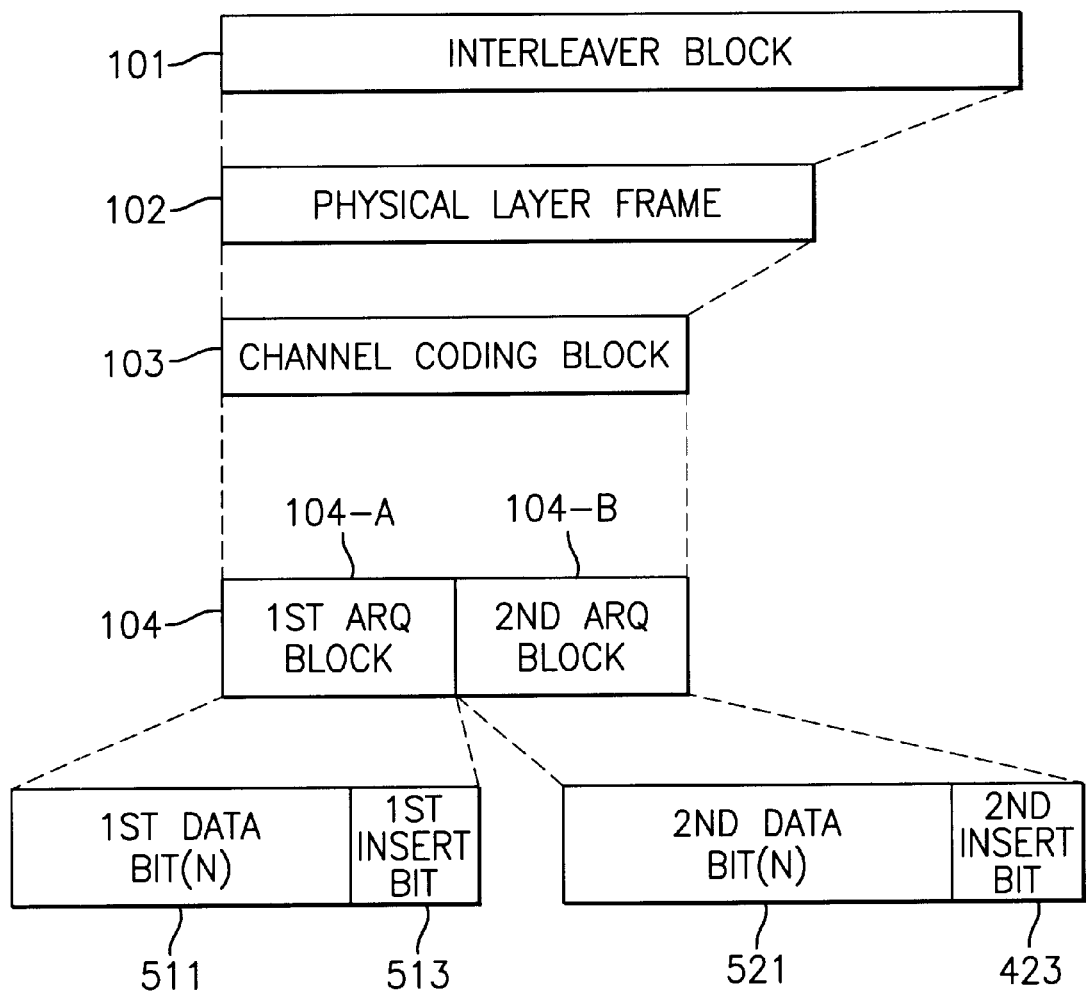
FIG. 6 is a diagram illustrating a layered frame structure, in which subframes are taken into consideration, for a mobile communication system using a turbo coder according to an embodiment of the present invention, wherein turbo tail bits and CRC bits are not used.

FIG. 6 illustrates a layered frame structure, in which subframes are taken into consideration, according to a fourth embodiment of the present invention. In this embodiment, a turbo coder, which is used for a channel coder, does not use tail bits or CRC bits.

Referring to FIG. 6, the turbo coder does not perform termination using the turbo tail bits and adds second insert bits. In the frame structure of FIG. 6, it is possible to improve throughput by removing CRC bits and then increasing first and second data bits 511 and 521 to equal the quantity of the CRC bits. Alternatively, it is also possible to improve performance of the turbo coder by increasing the quantity of the first insert bits 513 to twice of the CRC bits.

Figure 7A:
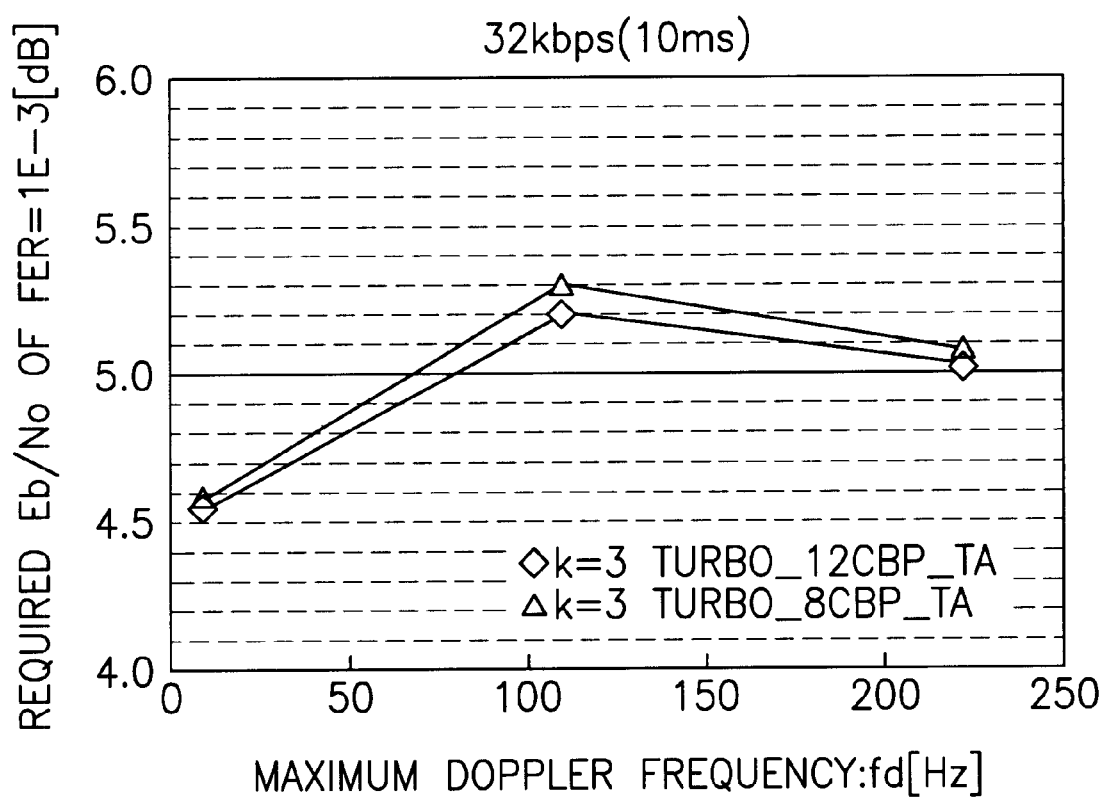
FIGS. 7A and 7B are frequency diagrams illustrating simulation results for performance with respect to the number of insert bits in a layered frame structure in which subframes are taken into consideration, in a mobile communication system using a turbo coder according to an embodiment of the present invention.

FIG. 7A illustrates a simulation result for performance with respect to the number of insert bits in a mobile communication system using a layered frame structure according to the first embodiment in accordance with FIG. 3 of the present invention. Simulation conditions are as follows:

Channel Model: ITU-R Rec. M. 1225 Channel-B
Carrier Frequency: 2 GHz
Mobile Speed: 3 km/h, 30 km/h, 60 km/h, 120 km/h
Information Bit Rate: 32 kbps(10 ms)
Chip Rate=4.096 Mcps
Ideal Channel Estimation
Diversity: 2-branch space diversity
RAKE: 2 fingers per branch
SIR based TPC(dynamic range 12 dB, step size 1 dB)
Turbo Code: K=3 with polynomial(7,5), MAP decoder with 8 iterations and 8-bit quantization It is noted that an SNR value required to maintain FER performance of $10^{-3}$ becomes lower, when the insert bits increase in number. Therefore, to maximize performance of the turbo coder, it is preferable to maximize the number of the insert bits and then puncture the insert bits from channel coded symbols.

Figure 7B:
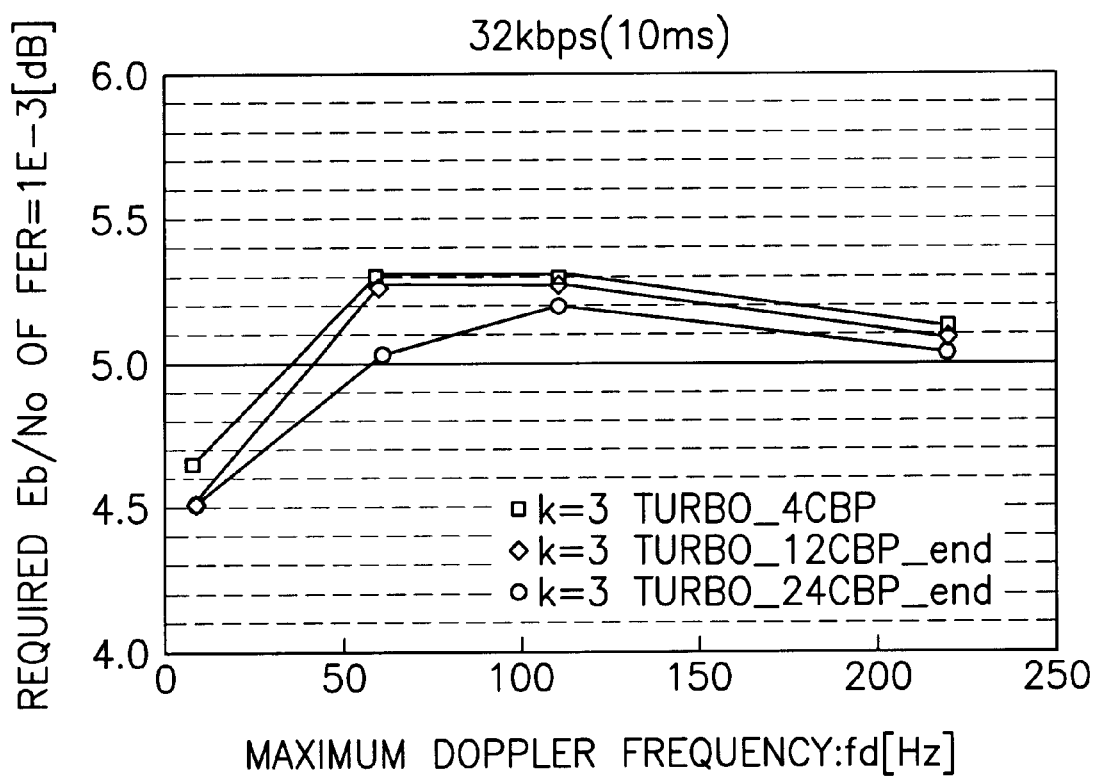

FIG. 7B illustrates a simulation result for performance with respect to the number of insert bits in a mobile communication system using a layered frame structure according to the second embodiment of FIG. 4. Although simulation conditions are the same as in FIG. 7A, the turbo coder has added the second insert bits without performing termination using the turbo tail bits. It can be noted from FIG. 7B that an SNR value required to maintain FER performance of $10^{-3}$ becomes lower, when the insert bits increase in number.

Now, a reference will be made to operation of the channel coders according to the first through fourth embodiments.

Figure 8:
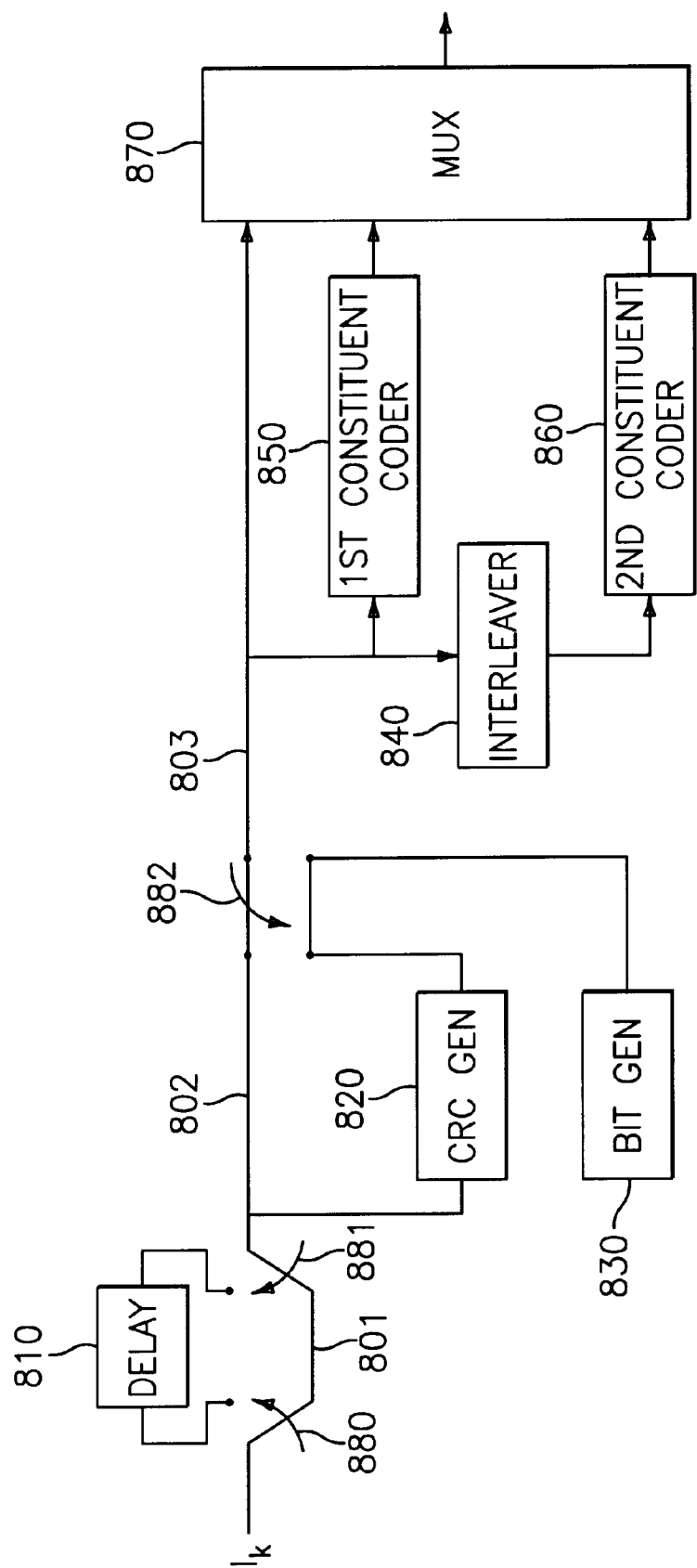
FIG. 8 is a block diagram illustrating a channel coding device according to a first embodiment of the present invention, for the layered structure of FIG. 3.
Figure 12:
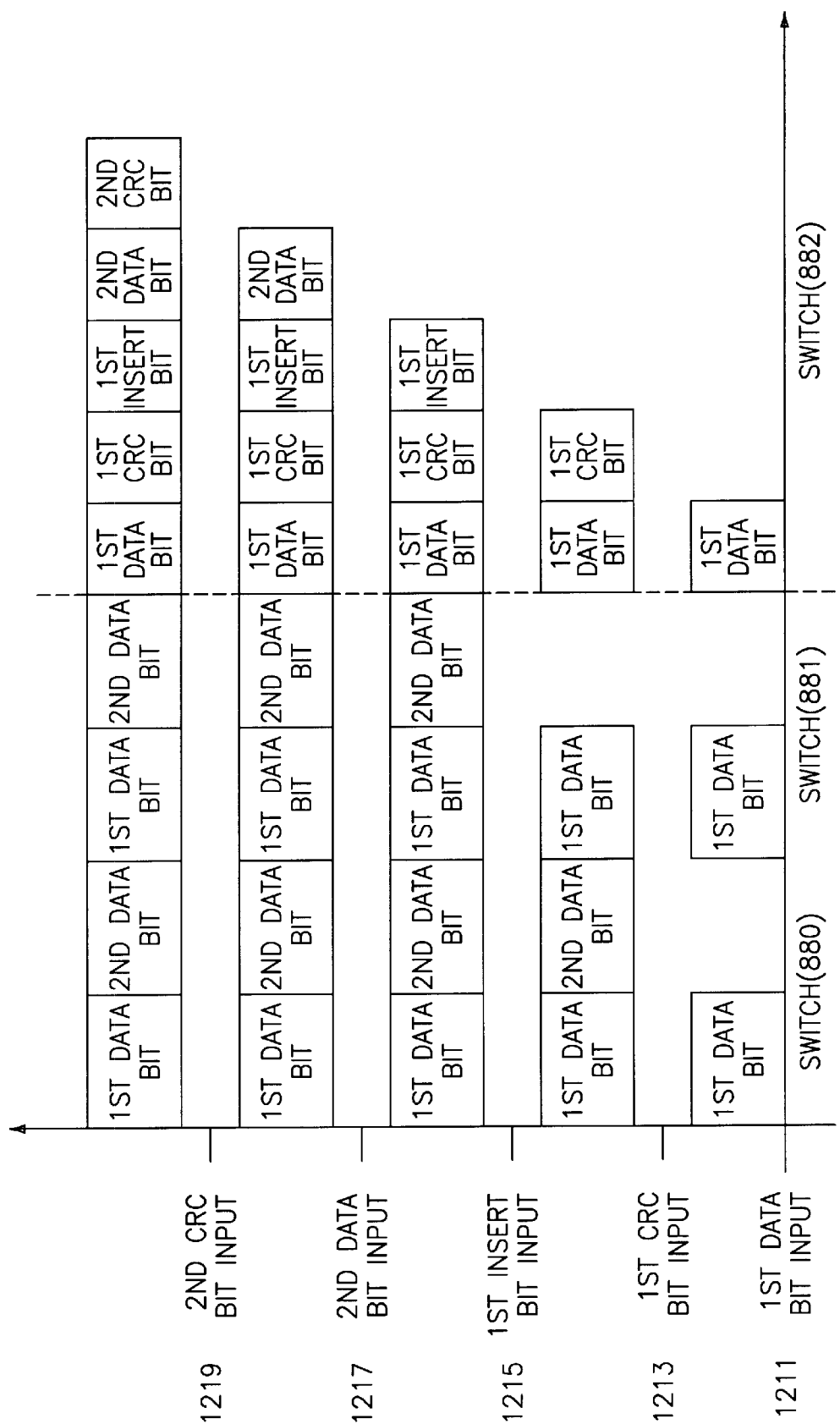
FIG. 12 is a timing diagram illustrating operation timing of a turbo coder according to the first embodiment of FIG. 8.

FIG. 8 illustrates a channel coding device for a layered frame structure of FIG. 3 according to the first embodiment of the present invention. FIG. 12 illustrates operation of the channel coder of FIG. 8, which codes data having a subframe structure according to the first embodiment. Therefore, it can be understood that the channel coder of FIG. 8 generates and transmits data having the frame structure of FIG. 3 according to the first embodiment. FIG. 12 is a timing diagram illustrating the procedure for generating data having the subframe structure according to the first embodiment, wherein an X-axis represents operation of switches 880, 881 and 882, and a Y-axis, being a time axis, represents timing of the bits output from the above switches.

Referring to FIGS. 8 and 12, upon receipt of input bits Ik, a switch 880 connects the input bits to a line 801 and a switch 881 connects the line 801 to a line 802 to apply first data bits to the line 802, as shown by reference numeral 1211 of FIG. 12. At this point, a switch 882 connects the line 802 to a line 803 to apply the first data bits on the line 803 to a coder, and a CRC generator 820 receiving the first data bits on the line 802 generates CRC bits. In this state, all the 360 first data bits 111 of FIG. 3 are input to the CRC generator 820, which generates CRC bits for the first data bits.

Thereafter, when the first data bits are completely input, the switch 880 is connected to a delay 810 and the switch 881 is disconnected or remains disconnected from the delay 810 for a while to shut off an input to the line 802, so that the second data bits, being subsequent input bits, are stored in the delay 810, as shown by reference numeral 1213 of FIG. 12. Further, when the switch 882 is connected to the CRC generator 820, the CRC generator 820 outputs 16 CRC bits for the first data bits and applies them to the coder through the switch 882. When the CRC bits are completely applied to the coder, the switch 882 is connected to a bit generator 830 to provide first insert bits 313, which are predetermined known bits, to the coder through it, as shown by reference numeral 1215 of FIG. 12.

After completion of the process for the first data bits, the switch 881 is connected to the delay 810 while the switch 880 maintains a connection to the delay 810, to provide the second data bits stored in the delay 810 to the line 802 as shown by reference numeral 1217 of FIG. 12. At this point, the switch 882 is connected to the line 802 to apply the second data bits to the coder, and the second data bits on the line 802 are also applied to the CRC generator 820, which calculates CRC bits for the second data bits.

Thereafter, when the second data bits are completely input, the switch 882 is connected to the CRC generator 820 to provide 16 CRC bits for the second data bits, output from the CRC generator 820, to the coder through it as shown by reference numeral 1219 of FIG. 12. When the first data bits, the first CRC bits, the second data bits and the second CRC bits are completely input to the coder part in such a manner, the coder part initiates a coding process for the input bits.

The coder is comprised of a first constituent coder 850, an interleaver 840, a second constituent coder 860 and a multiplexer 870. The first and second constituent coders 850 and 860 according to the first embodiment, insert bits and add tail bits to perform termination. The signals input to the coder are commonly provided to the multiplexer 870, the first constituent coder 850 and the interleaver 840. Further, interleaved input bits output from the interleaver 840 are applied to the second constituent coder 860. Here, the first and second constituent coders 850 and 860 are recursive systemic constituent coders, which generate the tail bits to be added.

In operation, the first constituent coder 850 codes the input bits and generates coded bits for the tail bits for termination. The first constituent coder 850 outputs first parity bits for the input bits and the tail bits, and provides the output bits to the multiplexer 870. The interleaver 840 interleaves the bits input to the coder and provides the interleaved bits to the second constituent coder 860, which codes the interleaved data bits in the same manner as in the first constituent coder 850 to generate second parity bits and tail bits. The second parity bits and tail bits output from the second constituent coder 860 are also applied to the multiplexer 870. The multiplexer 870 then punctures the data bits Ik to insert therein the insert bits.

Operation of such a coder is disclosed in detail in Korean patent application No. 1998–13956, entitled "Channel Coding Device and Method for Communication System", filed by the applicant.

In the decoding process, outputs of the multiplexer 870 are demultiplexed and specific bits are inserted at the insert locations where the insert bits are inserted. Such a channel decoder is disclosed in detail in Korean patent application No. 1998–32471, filed by the applicant In the second through fourth embodiments described hereafter, the decoder will decode the coded data in the same manner as stated above.

Figure 9:
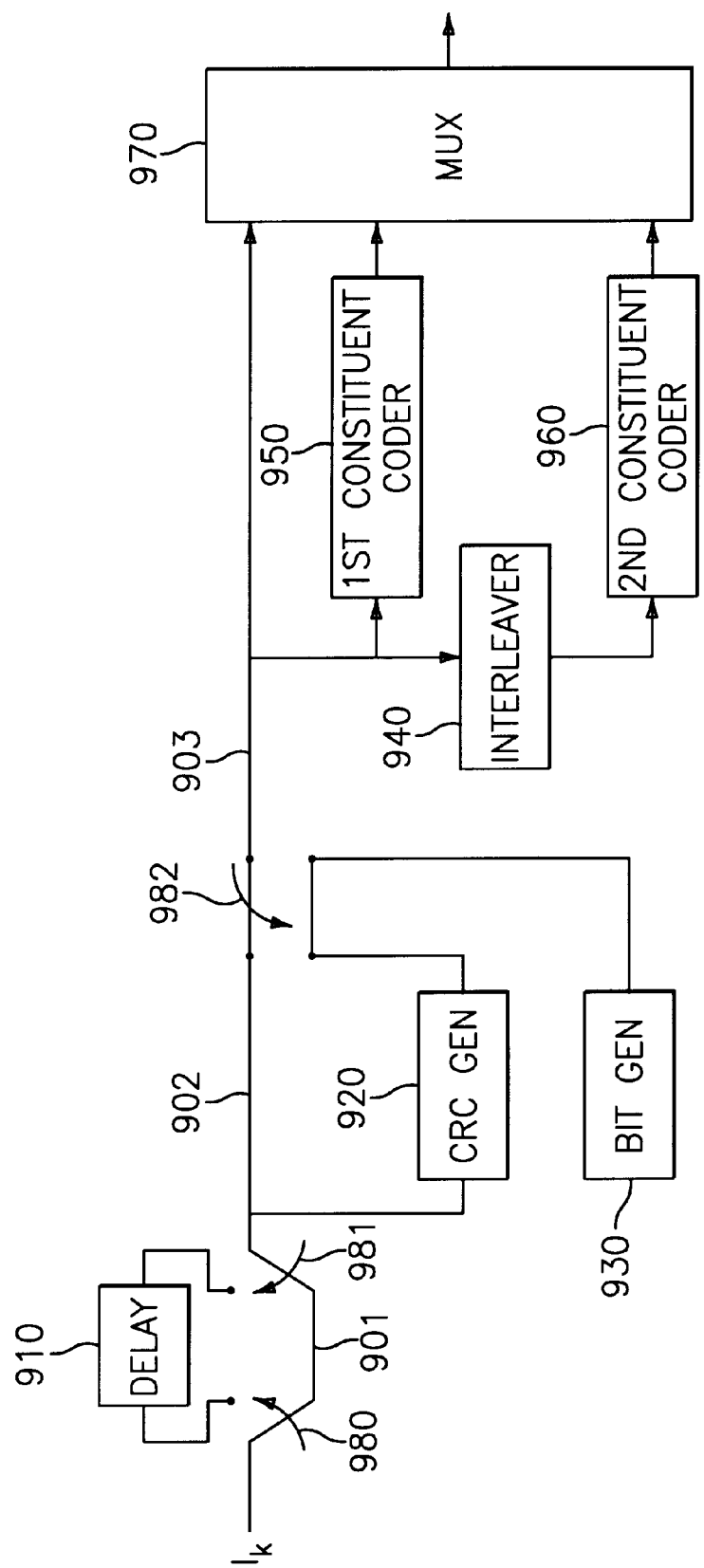
FIG. 9 is a block diagram illustrating a channel coding device according to a second embodiment of the present invention, for the layered structure of FIG. 4.
Figure 13:
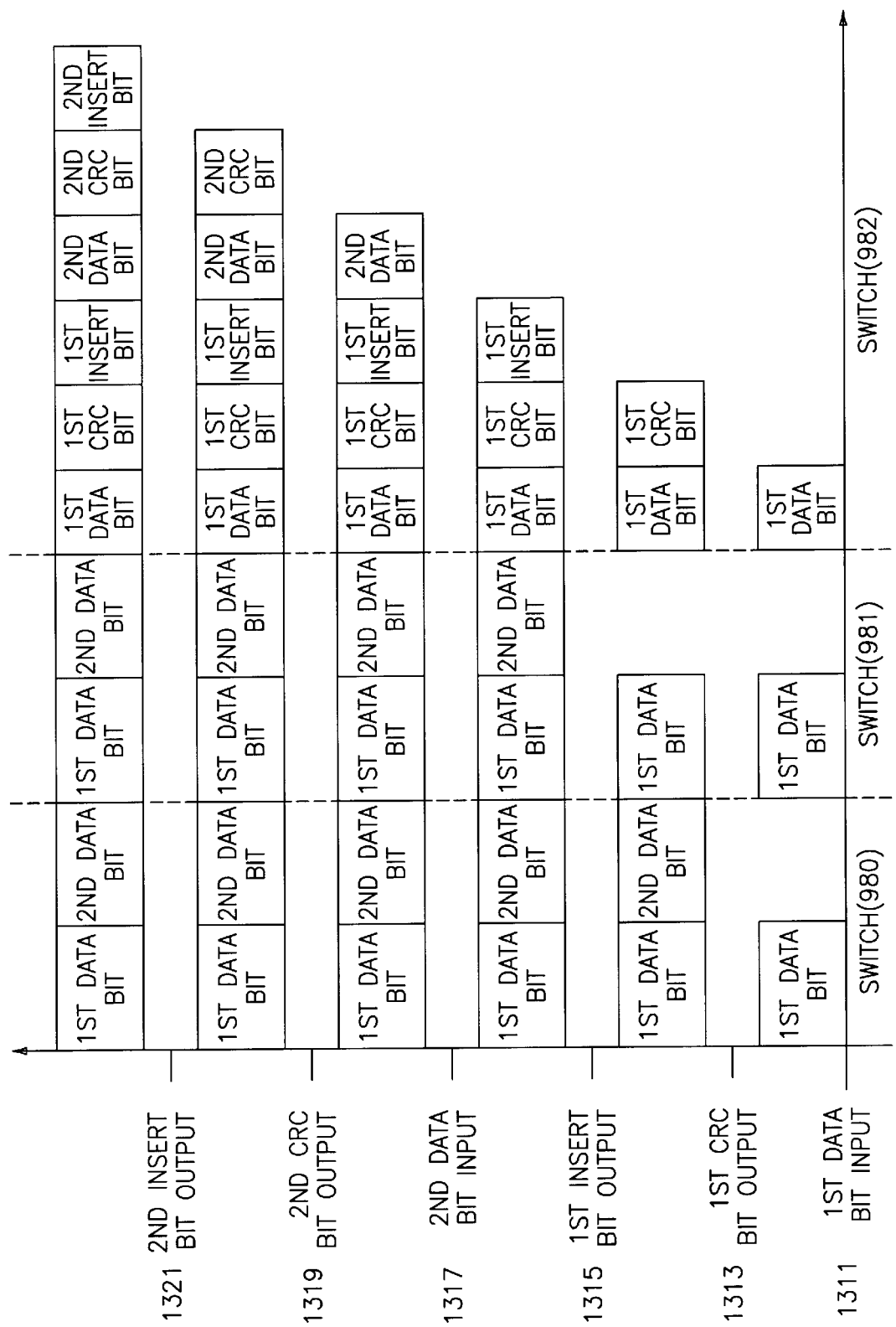
FIG. 13 is a timing diagram illustrating operation timing of a turbo coder according to the second embodiment of FIG. 9.

FIG. 9 illustrates a channel coding device for a layered frame structure of FIG. 4 according to the second embodiment of the present invention. FIG. 13 illustrates operation of the channel coder of FIG. 9, which codes data having a subframe structure according to the second embodiment. Therefore, it can be understood that the channel coder of FIG. 9 generates and transmits data having the frame structure of FIG. 4 according to the second embodiment. FIG. 13 is a timing diagram illustrating the procedure for generating data having the subframe structure according to the second embodiment, wherein an X-axis represents operation of switches 980, 981 and 982, and an Y-axis, being a time axis, represents timing of the bits output from the above switches.

Referring to FIGS. 9 and 13, upon receipt of input bits Ik, a switch 980 connects the input bits to a line 901 and a switch 981 connects the line 901 to a line 902 to apply first data bits to the line 902, as shown by reference numeral 1311 of FIG. 13. At this point, a switch 982 connects the line 902 to a line 903 to apply the first data bits on the line 903 in common to a coder and a CRC generator 920. While the 360 first data bits 111 of FIG. 4 are completely input, the CRC generator 920 calculates CRC bits for the first data bits.

Thereafter, when the first data bits are completely input, the switch 980 is connected to a delay 910 and the switch 981 is disconnected or remains disconnected from the delay 910 for a while to shut off an input to the line 902, so that the second data bits, being subsequent input bits, are stored in the delay 910, as shown by reference numeral 1313 of FIG. 13. Further, when the switch 982 is connected to the CRC generator 920, the CRC generator 920 outputs 16 CRC bits for the first data bits and applies them to the coder through the switch 982. When the CRC bits are completely applied to the coder, the switch 982 is connected to a bit generator 930 to provide first insert bits 313, which are predetermined known bits, to the coder through it, as shown by reference numeral 1315 of FIG. 13.

After completion of the process for the first data bits, the switch 981 is connected to the delay 910 while the switch 980 maintains a connection to the delay 910, to provide the second data bits stored in the delay 910 to the line 902 as shown by reference numeral 1317 of FIG. 13. At this point, the switch 982 is connected to the line 902 to apply the second data bits to the coder, and the second data bits on the line 902 are also applied to the CRC generator 920, which calculates CRC bits for the second data bits.

Thereafter, when the second data bits are completely input, the switch 982 is connected to the CRC generator 920 to provide 16 CRC bits for the second data bits, output from the CRC generator 920, to the coder through it as shown by reference numeral 1319 of FIG. 13. When the CRC bits are completely applied to the coder, the switch 982 is connected to the bit generator 930 to provide second insert bits 413, which are predetermined known bits, to the coder through it, as shown by reference numeral 1321 of FIG. 13.

When the first data bits, the first CRC bits, the second data bits and the second CRC bits are completely input to the coder part in such a manner, the coder part initiates a coding process for the input bits having the subframe structure of FIG. 4.

The coder is comprised of a first constituent coder 950, an interleaver 940, a second constituent coder 960 and a multiplexer 970. The first and second constituent coders 950 and 960 according to the second embodiment, do not perform termination. The signals input to the coder are commonly provided to the multiplexer 970, the first constituent coder 950 and the interleaver 940. Further, interleaved input bits output from the interleaver 940 are applied to the second constituent coder 960. Here, the first and second constituent coders 950 and 960 are recursive systemic constituent coders, which do not generate the tail bits for termination.

In operation, the first constituent coder 950 codes the input bits and provides the coded bits to the multiplexer 970. The interleaver 940 interleaves the bits input to the coder and provides the interleaved bits to the second constituent coder 960, which codes the interleaved data bits in the same manner as in the first constituent coder 950 to generate second parity bits. The second parity bits output from the second constituent coder 960 are also applied to the multiplexer 970. The multiplexer 970 then punctures the data bits Ik to insert therein the insert bits.

Figure 10:
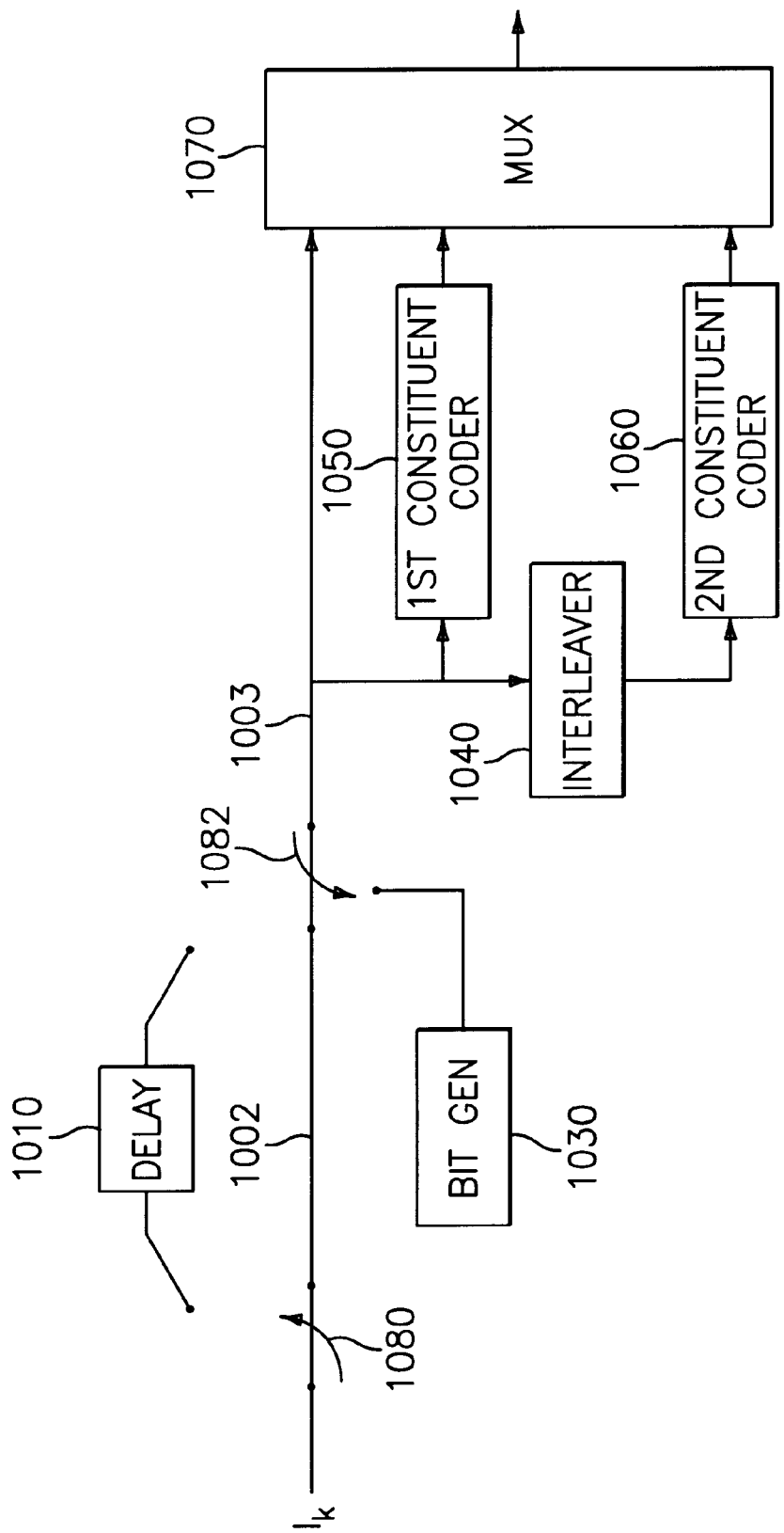
FIG. 10 is a block diagram illustrating a channel coding device according to a third embodiment of the present invention, for the layered structure of FIG. 3.
Figure 14:
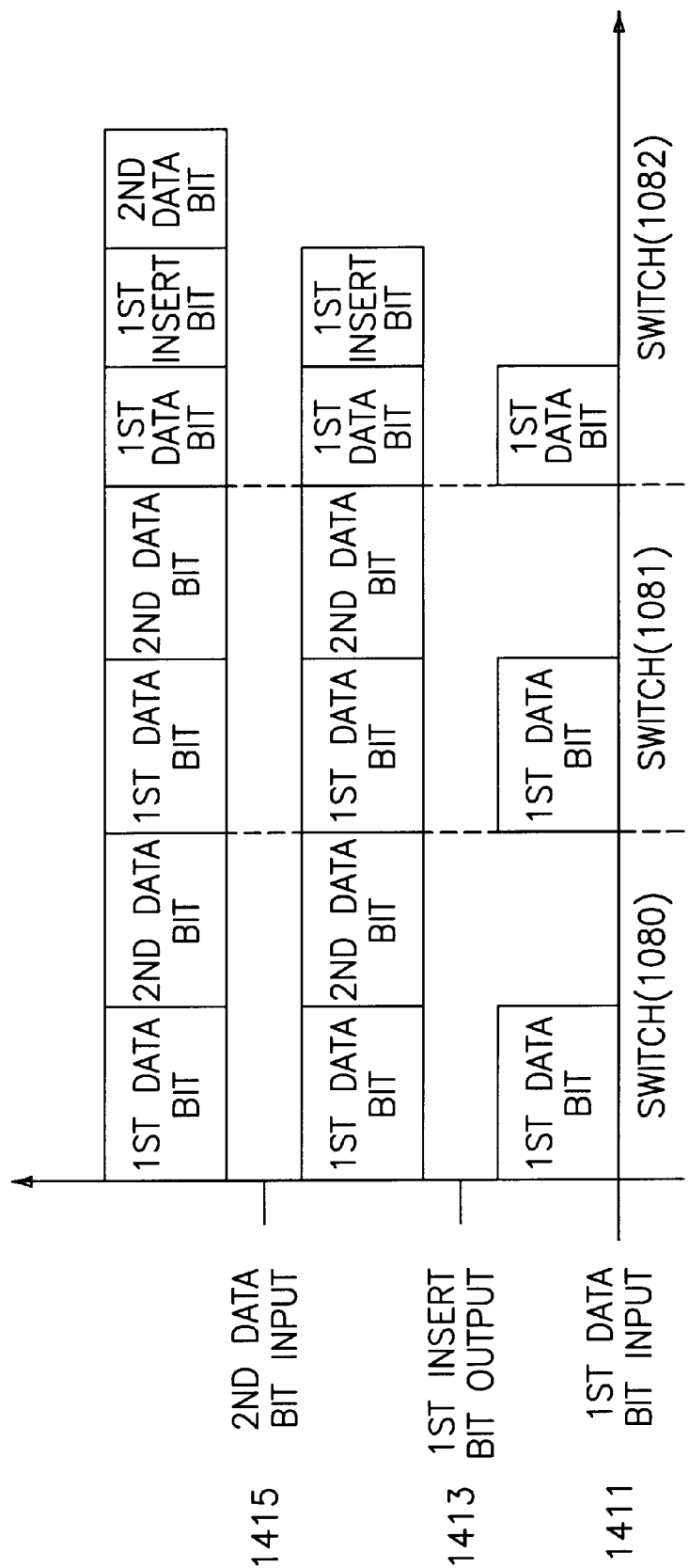
FIG. 14 is a timing diagram illustrating operation timing of a turbo coder according to the third embodiment of FIG. 10.

FIG. 10 illustrates a channel coding device for a layered frame structure of FIG. 5 according to the third embodiment of the present invention. FIG. 14 illustrates operation of the channel coder of FIG. 10, which codes data having a subframe structure according to the third embodiment. Therefore, it can be understood that the channel coder of FIG. 10 generates and transmits data having the frame structure of FIG. 5 according to the third embodiment. FIG. 14 is a timing diagram illustrating the procedure for generating data having the subframe structure according to the third embodiment, wherein an X-axis represents operation of switches 1080 and 1082, and a Y-axis, being a time axis, represents timing of the bits output from the above switches.

Referring to FIGS. 10 and 14, upon receipt of input bits Ik, a switch 1080 connects the input bits to a line 1002 to apply first data bits to the line 1002, as shown by reference numeral 1411 of FIG. 14. At this point, a switch 1082 connects the line 1002 to a line 1003 to apply the first data bits on the line 1002 to a coder. When the first data bits are completely applied to the coder, the switch 1082 is connected to a bit generator 1030 to provide first insert bits 513, which are predetermined known bits, to the coder through it, as shown by reference numeral 1413 of FIG. 14.

After completion of the process for the first data bits, the switch 1080 is connected to a delay 1010 to store second data bits 521 in the delay 1010, and the switch 1082 is connected to the delay 1010 to provide the second data bits 521 stored in the delay 1010 to the line 1003 as shown by reference numeral 1415 of FIG. 14. Thereafter, the switch 1082 is connected again to the line 1002 to apply the second data bits on the line 1002 to the coder. When the first data bits, the first insert bits and the second data bits are completely input to the coder in such a manner, the coder initiates a coding process for the input bits.

The coder is comprised of a first constituent coder 1050, an interleaver 1040, a second constituent coder 1060 and a multiplexer 1070. The first and second constituent coders 1050 and 1060 according to the third embodiment, insert bits and add tail bits to perform termination. The signals input to the coder are commonly provided to the multiplexer 1070, the first constituent coder 1050 and the interleaver 1040. Further, interleaved input bits output from the interleaver 1040 are applied to the second constituent coder 1060. Here, the first and second constituent coders 1050 and 1060 are recursive systemic constituent coders, which generate the tail bits for termination.

In operation, the first constituent coder 1050 codes the input bits and generates coded bits for the tail bits for termination. The first constituent coder 1050 outputs the first parity bits for the input bits and the tail bits, and provides the output bits to the multiplexer 1070. The interleaver 1040 interleaves the bits input to the coder and provides the interleaved bits to the second constituent coder 1060, which codes the interleaved data bits in the same manner as in the first constituent coder 1050 to generate second parity bits. The second parity bits output from the second constituent coder 1060 are also applied to the multiplexer 1070. The multiplexer 1070 then punctures the data bits Ik to insert therein the insert bits.

Figure 11:
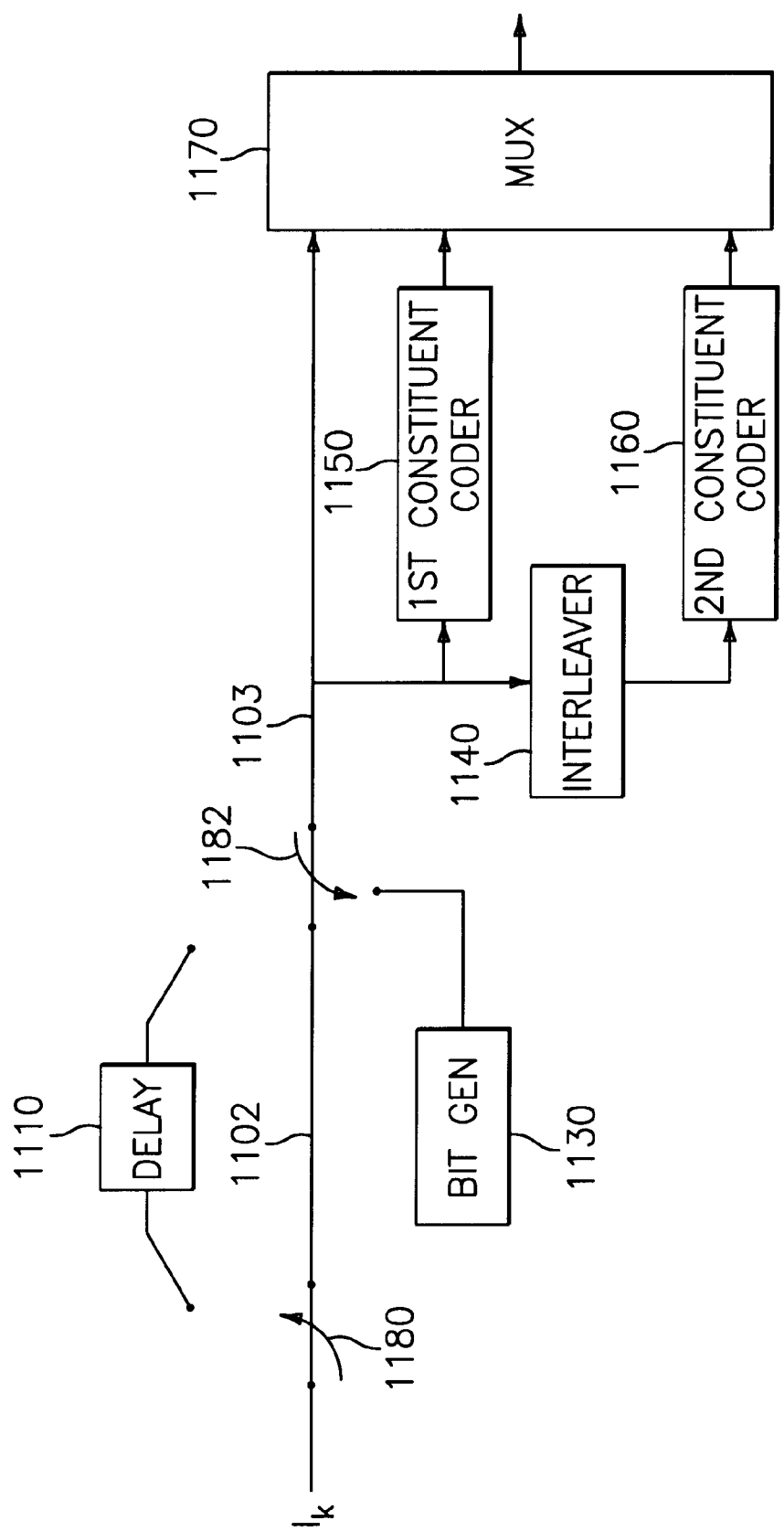
FIG. 11 is a block diagram illustrating a channel coding device according to a fourth embodiment of the present invention, for the layered structure of FIG. 3.
Figure 15:
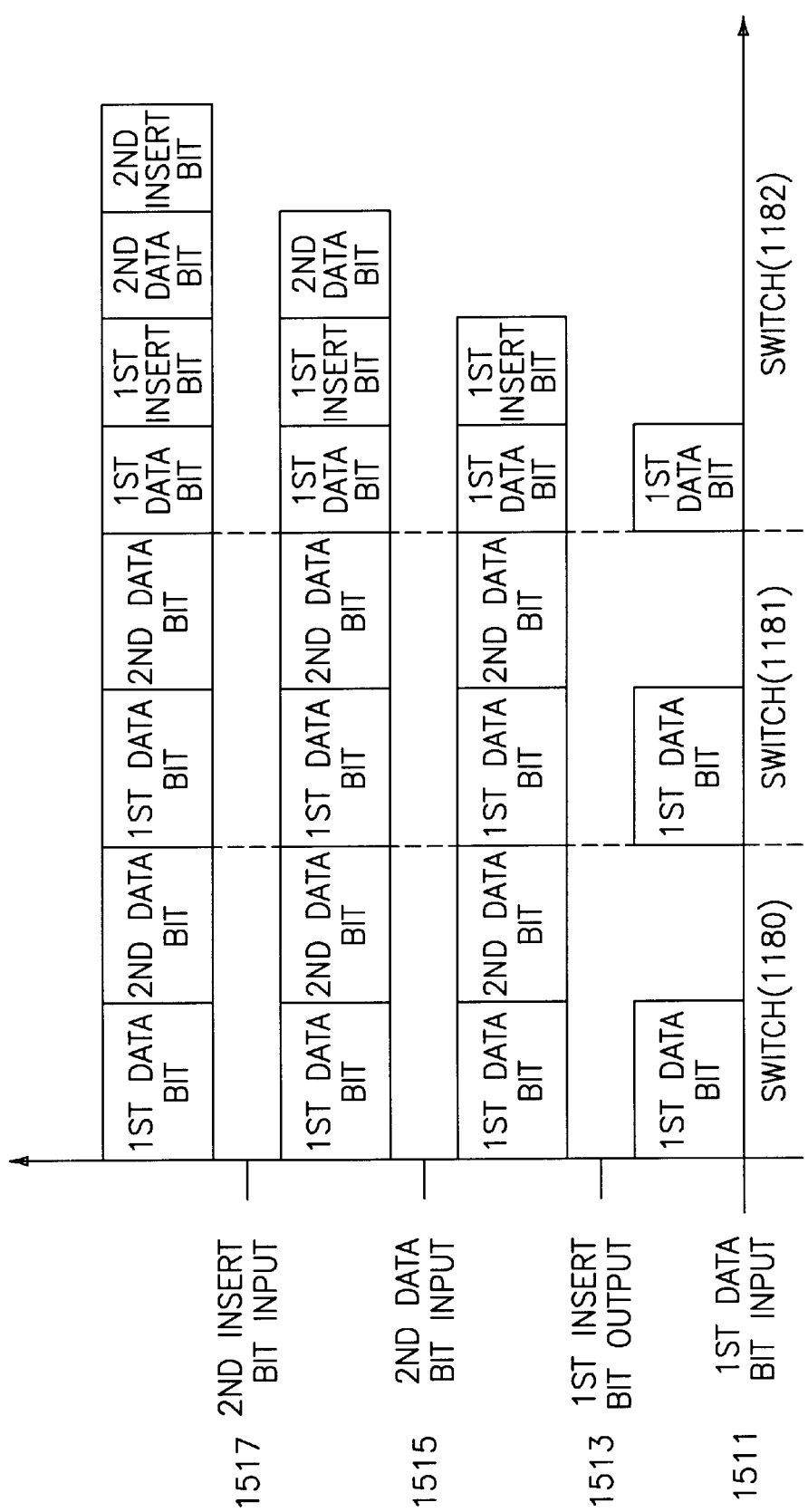
FIG. 15 is a timing diagram illustrating operation timing of a turbo coder according to the fourth embodiment of FIG. 11.

FIG. 11 illustrates a channel coding device for a layered frame structure of FIG. 6 according to the fourth embodiment of the present invention. FIG. 15 illustrates operation of the channel coder of FIG. 11, which codes data having a subframe structure according to the fourth embodiment. Therefore, it can be understood that the channel coder of FIG. 11 generates and transmits data having the frame structure of FIG. 6 according to the fourth embodiment. FIG.

15 is a timing diagram illustrating the procedure for generating data having the subframe structure according to the fourth embodiment, wherein an X-axis represents operation of switches 1180 and 1182, and a Y-axis, being a time axis, represents timing of the bits output from the above switches.

Referring to FIGS. 11 and 15, upon receipt of input bits Ik, a switch 1180 connects the input bits to a line 1102 to apply first data bits to the line 1102, as shown by reference numeral 1511 of FIG. 15. At this point, a switch 1182 connects the line 1102 to a line 1103 to apply the first data bits on the line 1102 to a coder. When the first data bits are completely applied to the coder, the switch 1182 is connected to a bit generator 1130 to provide first insert bits 513, which are predetermined known bits, to the coder through it, as shown by reference numeral 1513 of FIG. 15.

After completion of the process for the first data bits, the switch 1180 is connected to a delay 1110 to store second data bits 521 in the delay 1110, and the switch 1182 is connected to the delay 1110 to provide the second data bits 521 stored in the delay 1110 to the line 1103 as shown by reference numeral 1515 of FIG. 15. Thereafter, the switch 1182 is connected again to the line 1102 to apply the second data bits on the line 1102 to the coder, as shown by reference numeral 1517 of FIG. 15. When the first data bits, the first insert bits, the second insert bits and the second insert bits are completely input to the coder in such a manner, the coder initiates a coding process for the input bits.

The coder is comprised of a first constituent coder 1150, an interleaver 1140, a second constituent coder 1160 and a multiplexer 1170. The first and second constituent coders 1150 and 1160 according to the third embodiment, do not perform termination. The signals input to the coder are commonly provided to the multiplexer 1170, the first constituent coder 1150 and the interleaver 1140. Further, interleaved input bits output from the interleaver 1140 are applied to the second constituent coder 1160. Here, the first and second constituent coders 1150 and 1160 are recursive systemic constituent coders, which do not generate the tail bits for termination.

In operation, the first constituent coder 1150 codes the input bits to generate first parity bits and provides the coded bits (i.e., the first parity bits) to the multiplexer 1170. The interleaver 1140 interleaves the bits input to the coder and provides the interleaved bits to the second constituent coder 1160, which codes the interleaved data bits in the same manner as in the first constituent coder 1150 to generate second parity bits. The second parity bits output from the second constituent coder 1160 are also applied to the multiplexer 1170. The multiplexer 1170 then punctures the data bits Ik to insert therein the insert bits.

In sum, predetermined specific bits are inserted at the locations where an error probability is relatively higher in a whole ARQ block before channel coding. The error probability is determined by way of experiment. Since the insert locations are previously known to both the channel coder and the channel decoder, the turbo coder does not transmit the insert bits. Therefore, in the novel subframe structure, the FER performance depends on the number of the insert bits. That is, the FER performance is improved, when the insert bits increase in number.

While the invention has been shown and described with reference to a certain preferred embodiment thereof, it will be understood by those skilled in the art that various changes in form and details may be made therein without departing from the spirit and scope of the invention as defined by the appended claims.

What is claimed is:

1. A subframe data transmission device for a mobile communication system, comprising:

a bit generator for generating specific bits having a predetermined value;

a bit inserter for segmenting a received data bit stream into at least two subframes, and inserting the generated specific bits at locations where an error probability is higher in the respective subframes;

a first constituent coder for coding subframe data output from the bit inserter;

an interleaver for interleaving the subframe data output from the bit inserter;

a second constituent coder for receiving the interleaved subframe data from the interleaver and coding the interleaved subframe data; and a turbo coder for coding the subframe data comprised of the data bit stream and the specific bits.

2. The subframe data transmission device as claimed in claim 1, wherein the subframe is equal in size to an ARQ (Automatic Repeat Request) block, and the specific bits are inserted at a rear portion of the subframe.

3. The subframe data transmission device as claimed in claim 1, wherein the bit inserter comprises:

a delay for delaying the received data bit stream by the number of the specific bits to be inserted; and a selector for connecting, upon completion of receiving data bits for the subframe, the received data bits to the delay and applying an output of the bit generator to the turbo coder; and applying, when the specific bits are inserted, an output of the delay to the turbo coder.

4. The subframe data transmission device as claimed in claim 1, wherein the turbo coder is comprised of a multiplexer for receiving the subframe data, the coded subframe data, and the interleaved coded subframe data and puncturing the sub frame data to insert bits therein.

5. A subframe data transmission method for a mobile communication system having a bit generator for generating a specific bit having a predetermined value, comprising the steps of:

segmenting a received data bit stream into at least two subframes, and inserting the generated specific bit in the subframes at locations where an error probability is higher in the respective subframes;

coding the subframe data; and interleaving the subframe data and coding the interleaved subframe data.

6. The subframe data transmission method as claimed in claim 5, wherein the subframe is equal in size to an ARQ (Automatic Repeat Request) block, and the specific bits are inserted at a rear portion of the subframe.

7. The subframe data transmission method as claimed in claim 5, wherein the bit inserting step comprises the steps of:

upon completion of receiving data bits for the subframe, inserting the generated specific bits and delaying the received data bits; and outputting the delayed data bits, when the specific bits are inserted.

\* \* \* \* \*